(12) United States Patent
Peng et al.

(10) Patent No.: US 8,766,092 B2
(45) Date of Patent: Jul. 1, 2014

(54) ENERGY COLLECTION SYSTEMS AND METHODS

(75) Inventors: Zhen Peng, Foster City, CA (US); Marco Fiorentino, Mountain View, CA (US); David A. Fattal, Mountain View, CA (US); Nathaniel J. Quitoriano, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1095 days.

(21) Appl. No.: 12/579,407

(22) Filed: Oct. 14, 2009

(65) Prior Publication Data

US 2011/0083739 A1 Apr. 14, 2011

(51) Int. Cl.
*H01L 31/00* (2006.01)
*G02B 5/18* (2006.01)
*H01L 31/052* (2014.01)
*G02B 6/42* (2006.01)

(52) U.S. Cl.
CPC ............ *G02B 5/1809* (2013.01); *G02B 6/4298* (2013.01); *H01L 31/0522* (2013.01); *Y02E 10/52* (2013.01)
USPC .................... 136/259; 385/9; 385/10; 385/31; 385/37

(58) Field of Classification Search
CPC ............... G02B 5/1809; G02B 6/4298; H01L 31/0522; Y02E 10/52
USPC .............................. 136/259; 385/9, 10, 31, 37
See application file for complete search history.

(56) References Cited

U.S. PATENT DOCUMENTS

| 4,042,417 | A  | * | 8/1977 | Kaplow et al. ................ 136/246 |
| 4,045,246 | A  |   | 8/1977 | Mlavsky |
| 4,398,056 | A  |   | 8/1983 | Sheng |
| 4,536,608 | A  |   | 8/1985 | Sheng |
| 5,216,680 | A  |   | 6/1993 | Magnusson et al. |
| 6,322,938 | B1 |   | 11/2001 | Cohn |
| 6,700,054 | B2 |   | 3/2004 | Cherney et al. |
| 6,958,868 | B1 |   | 10/2005 | Pender |
| 7,167,615 | B1 |   | 1/2007 | Wawro et al. |
| 7,400,399 | B2 |   | 7/2008 | Wawro et al. |
| 2006/0174867 | A1 |   | 8/2006 | Schaafsma |
| 2007/0256726 | A1 |   | 11/2007 | Fork et al. |
| 2008/0041441 | A1 |   | 2/2008 | Schwartzman |
| 2008/0223438 | A1 | * | 9/2008 | Xiang et al. .................. 136/257 |
| 2008/0264486 | A1 | * | 10/2008 | Chen et al. .................... 136/259 |
| 2008/0316485 | A1 |   | 12/2008 | Wawro et al. |
| 2009/0056791 | A1 | * | 3/2009 | Pfenninger et al. ........... 136/247 |
| 2009/0152745 | A1 |   | 6/2009 | Gibson et al. |
| 2009/0277494 | A1 | * | 11/2009 | Mazzer et al. ................ 136/246 |
| 2009/0303154 | A1 | * | 12/2009 | Grbic et al. ................... 343/909 |
| 2010/0126577 | A1 | * | 5/2010 | Wu et al. ....................... 136/256 |

OTHER PUBLICATIONS

Eli Yablonovitch, "Thermodynamics of the fluorescent planar concentrator," .Opt.Soc.Am., vol. 70, No. 11, Nov. 1980, pp. 1362-1363.
S.S. Wang and R. Mangusson, "Theory and applications of guided mode resonance filters," Applied Optics, vol. 32, No. 14, May 10, 1993, pp. 2606-2613.
Vivian E. Ferry et al., "Plasmonic Nanostructure Design for Efficient Light Coupling into Solar Cells," Nano Letters 2008, vol. 8, No. 12, 4391-4397, ACS Nov. 14, 2008.

* cited by examiner

*Primary Examiner* — Matthew Martin

(57) ABSTRACT

An energy collection system is provided. The system can include an energy collection device and an energy concentration device disposed proximate at least a portion of the energy collection device. The energy concentration device includes a non-periodic, sub-wavelength, dielectric grating.

12 Claims, 4 Drawing Sheets

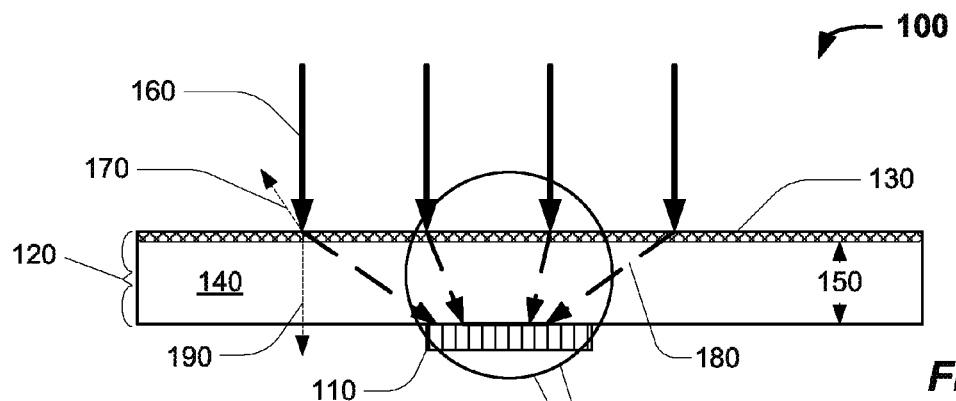
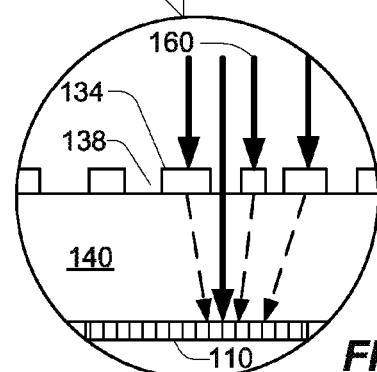
FIG. 1
FIG. 1A
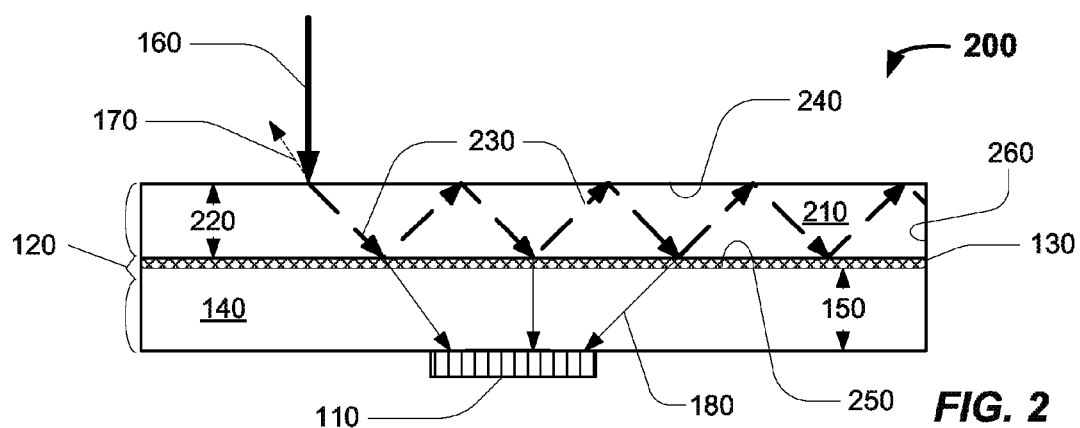
FIG. 2

ENERGY COLLECTION SYSTEMS AND METHODS

CROSS REFERENCES TO RELATED APPLICATIONS

The present application is a related to prior, co-pending, PCT patent application Ser. No. PCT/US2009/051026, entitled "Non-Period Grating Reflectors with Focusing Power and Methods for Fabricating Same" invented by David Fattal, Jingjing Li, Raymond Beausoleil, and Marco Fiorentino, filed Jul. 17, 2009, owned by the same assignee now and at the time of invention, and such application is incorporated by reference as if fully set forth herein.

BACKGROUND OF THE INVENTION

Description of the Related Art

Despite the vast potential energy source provided by the electromagnetic radiation released by the sun, efficient use of solar energy is hampered due to the diffuse nature of the energy received at the earth's surface. As such, facilities capable of converting the sun's electromagnetic radiation to electricity or other forms of energy on a commercial scale require significant real estate, thereby limiting the usefulness of the technology, particularly in congested urban areas.

SUMMARY OF THE INVENTION

An energy collection system is provided. The system can include an energy collection device and an energy concentration device disposed proximate at least a portion of the energy collection device. The energy concentration device includes a non-periodic, sub-wavelength, dielectric grating. In one or more embodiments, the energy collection device can be a solar energy collection device. In one or more embodiments, the energy concentration device can be a solar energy concentration device.

An energy collection method is also provided. The method can include disposing an energy concentration device proximate at least a portion of an energy collection device to provide an energy collection system. The energy concentration device can include a non-periodic, sub-wavelength, dielectric grating. The method can further include exposing the energy collection system to an incident electromagnetic radiation. The method can further include transmitting at least a portion of the incident electromagnetic radiation through at least a portion of the energy concentration device. The method can additionally include absorbing at least a portion of the transmitted electromagnetic radiation using the energy collection device. In one or more embodiments, the energy collection device can be a solar energy collection device. In one or more embodiments, the energy concentration device can be a solar energy concentration device.

A solar energy collection apparatus is also provided. The apparatus can include a solar energy collection device and a solar energy concentration device comprising a non-periodic sub-wavelength, dielectric grating attached to at least a portion of the solar energy collection device and a guided mode resonant waveguide disposed proximate at least a portion of the non-periodic sub-wavelength, dielectric grating.

As used herein, the term "electromagnetic radiation" refers to all electromagnetic radiation having wavelengths in both the visible and non-visible portions of the electromagnetic spectrum. The wavelength of the electromagnetic radiation can range continuously or discontinuously from about 10 nanometers (nm) to about 2500 nm. Electromagnetic radiation can include the ultraviolet portion of the spectrum (up to 400 nm), the visible portion of the spectrum (400 nm to 800 nm), and the infrared portion of the spectrum (above 800 nm).

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting of its scope, for other equally effective embodiments may exist.

Advantages of one or more disclosed embodiments may become apparent upon reading the following detailed description and upon reference to the drawings in which:

FIG. 1 depicts an elevation view of an exemplary energy collection system, according to one or more embodiments described herein;

FIG. 1A depicts an detail view of an exemplary non-periodic, sub-wavelength, dielectric grating disposed on the exemplary energy collection system depicted in FIG. 1, according to one or more embodiments described herein;

FIG. 2 depicts an elevation view of another exemplary energy collection system, according to one or more embodiments described herein;

DETAILED DESCRIPTION

Figure 3:
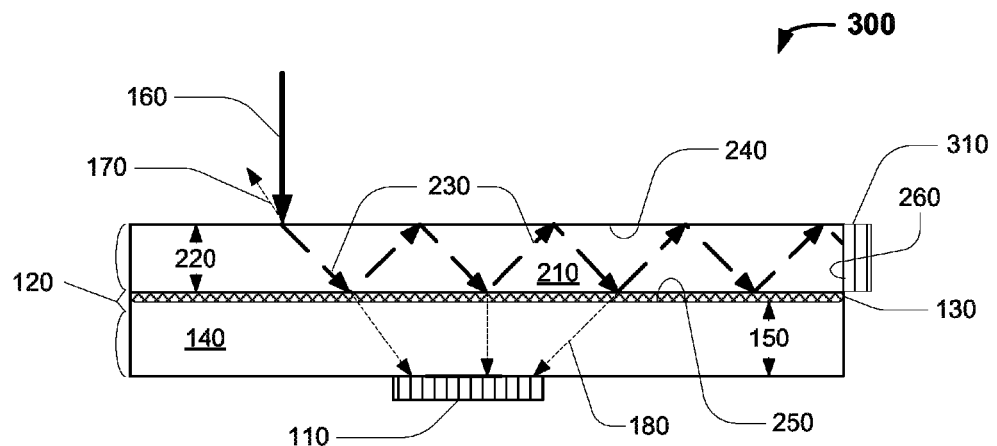
FIG. 3 depicts an elevation view of yet another exemplary energy collection system, according to one or more embodiments described herein.

FIG. 1 depicts an elevation view of an exemplary energy collection system 100 according to one or more embodiments. FIG. 1A depicts an exploded view of an exemplary non-periodic, sub-wavelength, dielectric grating 130 disposed on the exemplary energy collection system 100 depicted in FIG. 1, according to one or more embodiments. The system 100 can include an energy collection device 110 and an energy concentration device 120 suitable for concentrating at least a portion of the incident electromagnetic radiation 160 onto at least a portion of the energy collection device 110.

The energy concentration device 120 can include, but is not limited to, a non-periodic, sub-wavelength, dielectric grating 130 and a substrate 140 having a thickness 150 disposed proximate at least a portion of the energy collection device 110. In one or more embodiments, a portion 170 of the incident electromagnetic energy 160 can be reflected by the non-periodic, sub-wavelength, dielectric grating 130. In one or more embodiments, a portion of the incident electromagnetic energy 160 can be concentrated at a focal point via refraction and reflection from the non-periodic, sub-wavelength, dielectric grating 130 and transmission 180 through all or a portion of the substrate 140. In one or more embodiments, a portion 190 of the incident electromagnetic energy 160 can pass through the non-periodic, sub-wavelength, dielectric grating 130 and substrate 140.

The energy collection device 110 can include one or more systems, devices, or any combination of systems and devices suitable for the collection of electromagnetic radiation. In one or more embodiments, the energy collection device 110 can also convert the collected electromagnetic energy into another energy form, for example electricity, or a heated fluid such as steam. The energy collection device 110 can include one or more solar cells sensitive to the electromagnetic radiation spectrum transmitted by the sun. The energy collection device 110 can include, but is not limited to, one or more crystalline solar cells capable of converting at least a portion of the incident electromagnetic energy 160 to electrical power via a photovoltaic effect Exemplary photovoltaic devices capable of providing the energy collection device 110 include single-junction cells, double-junction cells, or triple-junction cells. In one or more embodiments, suitable photovoltaic devices for providing the solar energy collection device 110 can include, but are not limited to, crystalline-based cells, such as single crystal silicon, polycrystalline silicon, amorphous silicon, gallium arsenide, copper indium diselenide and cadmium telluride. Other photovoltaic devices can also be used to provide all or a portion of the solar energy collection device 110, for example: thin-film photovoltaic cells, metamorphic multi-junction solar cells, conductive polymer cells, quantum heterostructure cells (carbon nanotubes or quantum dots embedded in conductive polymers or mesoporous metal oxides), transparent thin film conductor cells, infrared solar cells, ultraviolet solar cells, and three dimensional cells.

The energy concentration device 120 can include a non-periodic, sub-wavelength, dielectric gratings 130. The energy concentration device 120 can also be completely or partially included within the substrate 140. In one or more embodiments, the substrate 140 can have a uniform or near uniform thickness.

The non-periodic, sub-wavelength, dielectric grating 130 can reflect and refract all or a portion of the incident electromagnetic energy 160 to at least one focal point. The at least one focal point can be located at a distance 150 from the non-periodic, sub-wavelength, dielectric grating 130. In one or more embodiments, the thickness of at least a portion of the substrate 140 can be about equal to the focal point distance 150.

The non-periodic, sub-wavelength, dielectric grating 130 can be a planar structure or can be adapted to a simple (e.g., cylindrical) or compound (e.g., spherical or hemispherical) curved surface. In one or more embodiments, the non-periodic, sub-wavelength, dielectric grating 130 can be a portion of the substrate 140, for example, the grating 130 can be inscribed in all or a portion of the dielectric 140 surface exposed to the electromagnetic radiation 160. In one or more embodiments, the non-periodic, sub-wavelength, dielectric grating 130 can be a distinct layer, attached or otherwise bonded to the substrate 140.

The non-periodic, sub-wavelength, dielectric grating 130 can include any substance 134 having a relatively higher refractive index than the underlying substrate 140. For example, the non-periodic, sub-wavelength, dielectric grating 130 can be composed of silicon ("Si"), while the underlying substrate 140 can be composed of quartz or silicon dioxide ("$SiO_2$"); or the grating 130 can be composed of gallium arsenide ("GaAs"), while the underlying substrate is composed of aluminum gallium arsenide ("AlGaAs") or aluminum oxide ("$AlO_2$").

The non-periodic, sub-wavelength, dielectric grating 130 can include a substance 134 having a regular or irregular series of channels or apertures 138 disposed therein. In one or more embodiments, the width of the channels or apertures 138 can be less than the wavelength of at least a portion of the incident electromagnetic radiation 160.

FIG. 2 depicts an elevation view of another exemplary energy collection system 200, according to one or more embodiments. The system 200 can include a waveguide 210 having a thickness 220 disposed proximate at least a portion of the non-periodic, sub-wavelength, dielectric grating 130. The waveguide 210 can be any number of systems, devices, or combinations of systems and devices suitable for propagating all or a portion of the incident electromagnetic radiation 160 through at least a portion of the waveguide 210. In one or more embodiments, the waveguide 210 can be a guided mode resonant ("GMR") waveguide. In one or more specific embodiments, the waveguide 210 can be a transparent, dielectric, material. In one or more embodiments, the waveguide 210 can be a planar system having an upper surface 240, a lower surface 250, and an edge 260.

In one or more embodiments, resonance within the waveguide 210 can occur at various, specific, combinations of electromagnetic radiation incident angle and frequency. When resonance is achieved, the non-periodic, sub-wavelength, dielectric grating 130 can provide for the propagation of at least a portion of the incident electromagnetic radiation 160 as a guided mode 230 within the waveguide 210. At least a portion of the off-resonant electromagnetic energy incident on the grating 130 can exit the waveguide 210, reflecting or refracting off the non-periodic, sub-wavelength, dielectric grating 130 disposed proximate the waveguide 210. At least a portion of the off-resonance electromagnetic energy incident on the grating 130 can be concentrated and transmitted 180 through all or a portion of the underlying substrate 140 to the solar collection device 110.

In one or more embodiments, all or a portion of the incident electromagnetic radiation 160 can be propagated 230 within the waveguide 210. At least a portion of the propagated electromagnetic radiation 230 can remain trapped or coupled within the waveguide 210 until reaching a waveguide edge 260 or an additional coupling device permitting at least a portion of the electromagnetic radiation 230 to exit the waveguide 210. In one or more embodiments, as the propagated electromagnetic radiation 230 impacts the surface of the guided mode resonant waveguide 210 disposed adjacent to the non-periodic, sub-wavelength, dielectric grating 130, all or a portion of the electromagnetic radiation 230 can exit the waveguide, reflect or refract from the grating 130, pass through the substrate 140 and enter the energy collection device 110. Thus, propagating at least a portion of the electromagnetic radiation 230 within the waveguide 210 can result in improved performance of the energy collection device 110 due to the increased ability to provide additional energy from the collection of at least a portion of electromagnetic radiation 230 propagated within the waveguide 210.

FIG. 3 depicts an elevation view of yet another exemplary energy collection system 300, according to one or more embodiments. The system 300 can include an energy collection device 110 having an energy concentration device 120 disposed proximate thereto. The concentration device 120 can include, similar to the system 200 depicted in FIG. 2, a non-periodic, sub-wavelength, dielectric grating 130 having a substrate 140 disposed proximate the energy collection device 110, and a waveguide 210 disposed proximate at least a portion of the grating 130. Differentiating the system 300 from the system 200 is the installation of a second energy collection device 310, proximate at least a portion of the waveguide edge 260.

The installation of the second energy collection device 310 can improve the overall collection efficiency of the system 300. In one or more embodiments, the second energy collection device 310 can be disposed proximate at least a portion of the waveguide edge 260. As depicted in FIG. 3, at least a portion of the propagated electromagnetic radiation 230 trapped within the waveguide 210 can exit along at least a portion of the waveguide edge 260. At least a portion of the propagated electromagnetic radiation 230 exiting the waveguide edge 260 can fall incident upon at least a portion of the second energy collection device 310.

A portion of the propagated electromagnetic radiation 230 can exit the waveguide lower surface 250. At least a portion of the electromagnetic radiation 180 exiting the waveguide lower surface 250 can eventually enter the energy collection device 110 after passing through the non-periodic, sub-wavelength, dielectric grating 130 and substrate 140. Another portion of the propagated electromagnetic radiation 230 within the waveguide 210 can exit the waveguide edge 260. At least a portion of the propagated electromagnetic radiation 230 exiting the waveguide edge 260 can enter the second energy collection device 310.

The second energy collection device 310 can include one or more systems, devices, or any combination of systems and devices suitable for the collection of electromagnetic radiation. In one or more embodiments, the second energy collection device 310 can be a solar energy collection device suitable for the conversion of the collected electromagnetic radiation into another energy form, for example electricity or a heated fluid such as steam. The second energy collection device 310 can include, but is not limited to, one or more crystalline solar cells capable of converting at least a portion of the propagated electromagnetic radiation 230 to electrical power via a photovoltaic effect.

Exemplary photovoltaic devices capable of providing the second energy collection device 310 include single-junction cells, double-junction cells, or triple-junction cells. In one or more embodiments, suitable photovoltaic devices for providing the second solar energy collection device 310 can include, but are not limited to, crystalline-based cells, such as single crystal silicon, polycrystalline silicon, amorphous silicon, gallium arsenide, copper indium diselenide and cadmium telluride. Other photovoltaic devices can also be used to provide all or a portion of the second solar energy collection device 310, for example: thin-film photovoltaic cells, metamorphic multi-junction solar cells, conductive polymer cells, quantum heterostructure cells (carbon nanotubes or quantum dots embedded in conductive polymers or mesoporous metal oxides), transparent thin film conductor cells, infrared solar cells, ultraviolet solar cells, and three dimensional cells.

Figure 4:
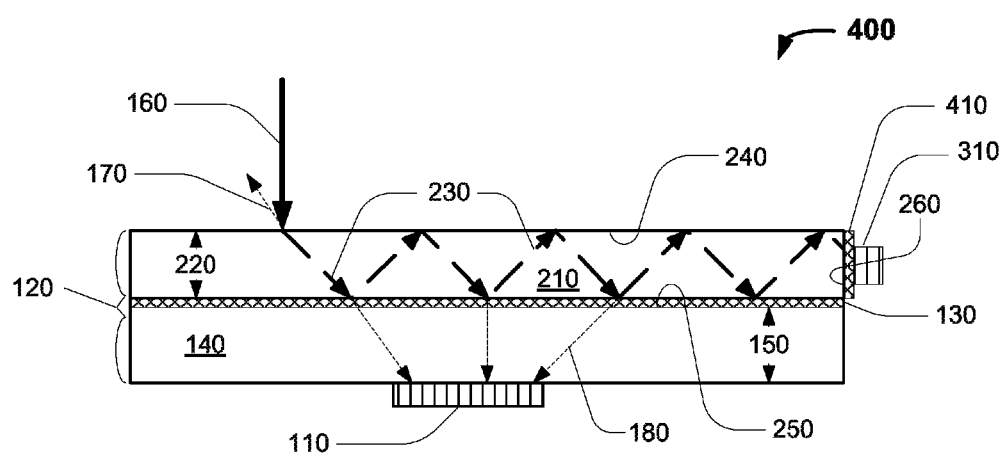
FIG. 4 depicts an elevation view of yet another exemplary energy collection system, according to one or more embodiments described herein.

FIG. 4 depicts an elevation view of yet another exemplary energy collection system 400, according to one or more embodiments. The system 400 can include an energy collection device 110 having a concentration device 120 disposed proximate thereto. The concentration device 120 can include, similar to the system 200 depicted in FIG. 2, a non-periodic, sub-wavelength, dielectric grating 130 having a substrate 140 disposed proximate the energy collection device 110, and a waveguide 210 disposed proximate at least a portion of the grating 130. Differentiating the system 400 from the system 300 is the installation of a second non-periodic, sub-wavelength, dielectric grating 410, disposed between at least a portion of the waveguide edge 260 and the second energy collection device 310.

At least a portion of the propagated electromagnetic radiation 230 can exit at least a portion of the waveguide edge 260. At least a portion of the propagated electromagnetic radiation 230 exiting the waveguide edge 260 can be reflected or refracted by the second non-periodic, sub-wavelength, dielectric grating 410 prior to entering the second energy collection device 310. The second non-periodic, sub-wavelength, dielectric grating 410 can permit the use of a smaller second energy collection device 310 due to the ability of the grating 410 to focus at least a portion of the propagated electromagnetic radiation 230 exiting the waveguide 210.

Figure 5:
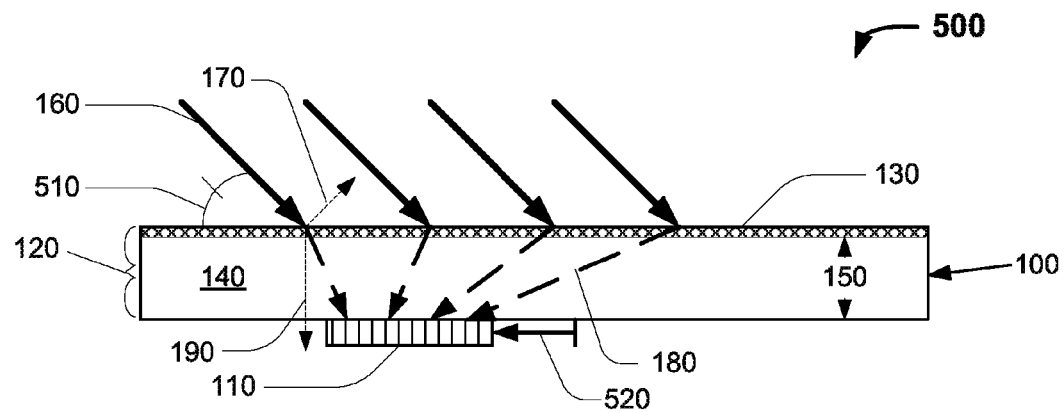
FIG. 5 depicts an elevation view of yet another exemplary energy collection system, according to one or more embodiments described herein.

FIG. 5 depicts an elevation view of yet another exemplary energy collection system 500, according to one or more embodiments. In one or more embodiments, all or a portion of the incident electromagnetic radiation 160 can strike the collection system 100 at an angle 510. In one or more embodiments, the focal point of the non-periodic, sub-wavelength, dielectric grating 130 can be shifted or displaced by a distance 520 as a consequence of the angle of incidence 510 of the incoming electromagnetic radiation 160. In one or more embodiments, the displacement distance 520 can vary based upon the angle 510 of the incident electromagnetic radiation 160. On collection systems 100 having a fixed energy collection device 110, the displacement distance 520 can by outside of the area covered by the energy collection device 100.

Figure 6:
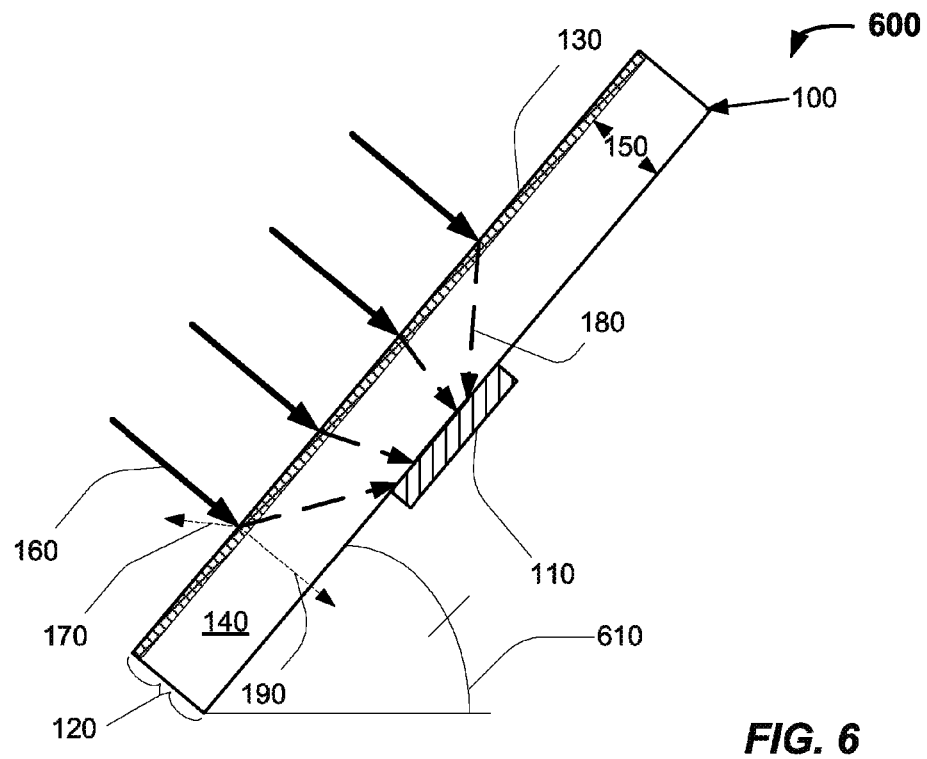
FIG. 6 depicts an elevation view of yet another exemplary energy collection system, according to one or more embodiments described herein.

FIG. 6 depicts an elevation view of yet another exemplary energy collection system 600, according to one or more embodiments. In one or more embodiments, the energy collection system 100 can be disposed at an angle 610. In one or more embodiments, the angle 610 can be established to maintain a fixed angle between the incident electromagnetic radiation 160 and the energy collection system 100. For example, the angle 610 can be established to maintain an approximate 90° between the system 100 and the incident electromagnetic radiation 160 as depicted in FIG. 6. By maintaining a fixed angle between the incident electromagnetic radiation 160 and the energy collection system 100, the focal point can be maintained in a relatively stable position thereby permitting the use of a smaller energy collection device 110, for example a smaller solar cell.

While the energy collection system 100 is depicted as an exemplary embodiment in FIG. 6, it should be noted that any embodiments of the energy collection system, for example systems 200, 300, and 400, could be similarly disposed at an angle 610 to maintain a fixed angle between the incident electromagnetic radiation 160 and the energy collection system.

Figure 7:
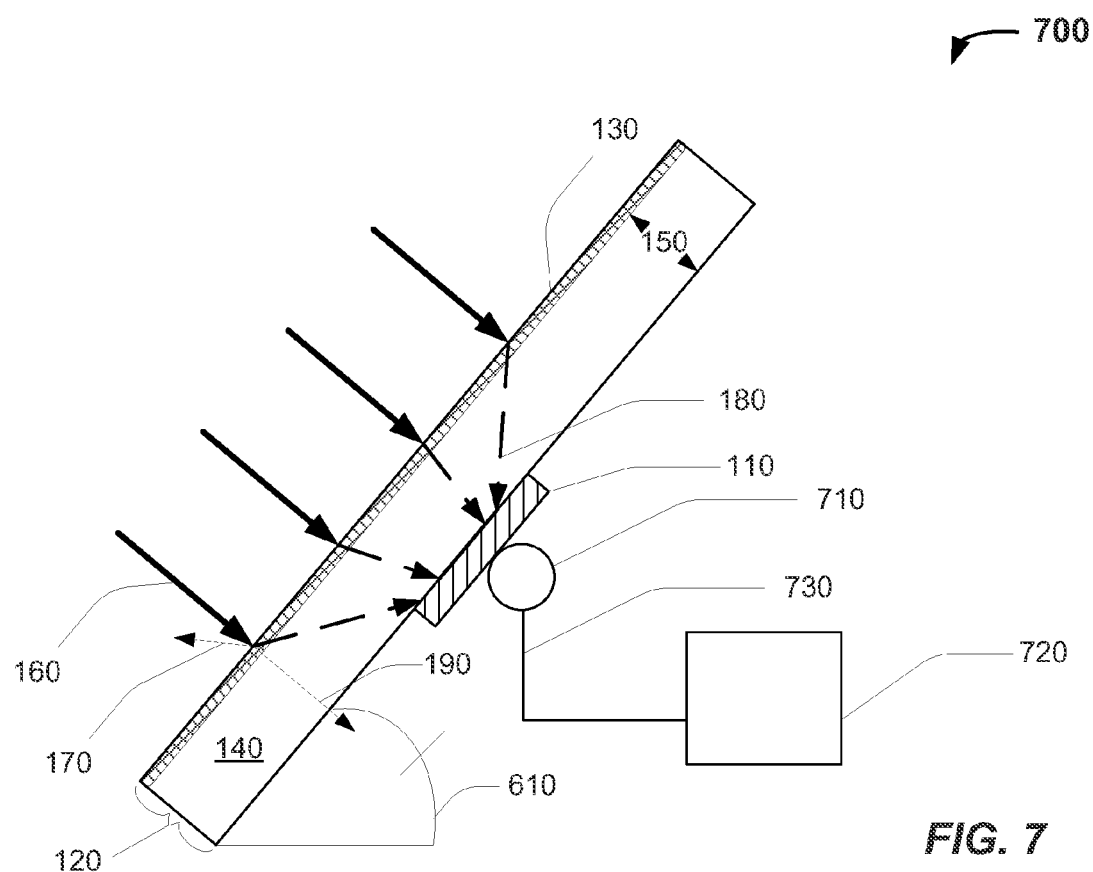
FIG. 7 depicts an elevation view of yet another exemplary energy collection system, according to one or more embodiments described herein.

FIG. 7 depicts an elevation view of yet another exemplary energy collection system 700, according to one or more embodiments. In one or more embodiments, the system 700 can include a pivot 710 capable of pivoting about at least 2 axes and a controller 720, communicatively connected via one or more conduits 730. One or more predetermined setpoints can be disposed in, on, or about the controller 720. In one or more embodiments, the one or more setpoints can include, for example a desired angle between the system 100 and the incident electromagnetic radiation 160. In one or more embodiments, the controller 130 can directly or indirectly track the angle of the incident electromagnetic radiation 160 and make corrections to the position of the system 100 using the pivot to maintain the desired incident angle.

In one or more embodiments, the controller 720 can measure or otherwise determine the power output of the energy collection device 110, and can adjust the position of the system 100 to maintain maximum energy output from the system 100.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

While the foregoing is directed to embodiments of the present invention, other and further embodiments of the invention may be devised without departing from the basic scope thereof, and the scope thereof is determined by the claims that follow.

What is claimed is:

1. An energy collection system, comprising:
    an energy collection device;
    an energy concentration device comprising a planar substrate and a non-periodic, sub-wavelength, dielectric grating disposed on a first surface of the planar substrate, the energy collection device being external to the energy concentration device and at least a portion of the energy collection device being disposed at a second surface of the planar substrate opposite the first surface; and
    a guided mode resonant waveguide disposed as a layer adjacent to the first surface of the energy concentration device, the energy concentration device being sandwiched between the guided mode resonant waveguide and the energy collection device,
    wherein the dielectric grating is to couple incident electromagnetic radiation into the planar substrate, the coupled electromagnetic radiation to pass through the planar substrate and into the energy collection device, and wherein the energy concentration device is to receive electromagnetic radiation coupled from the guided mode resonant waveguide by the dielectric grating.

2. The system of claim 1, wherein the energy collection device comprises a solar energy collection device; and
    wherein the energy concentration device comprises a solar energy concentration device.

3. The system of claim 1, wherein the energy concentration device is adapted to adjust the phase of electromagnetic radiation incident upon the energy concentration device;
    wherein the phase adjusted electromagnetic radiation comprises at least one focal point having a first focal length; and
    wherein the thickness of the substrate is approximately equal to the first focal length.

4. The system of claim 1, further comprising a pivot to permit the movement of the energy concentration device and the energy collection device in relation to at least a portion of the incident electromagnetic radiation.

5. The system of claim 2, wherein the solar collection device is selected from the group of collection devices consisting of: a solar electric cell adapted to provide a current output; a solar thermal cell adapted to provide a heated fluid; and a solar thermal cell adapted to provide a heated member.

6. The system of claim 1, further comprising a second energy collection device disposed at an end of the guided mode resonant waveguide.

7. The system of claim 6, wherein the second energy collection device comprises a solar energy collection device selected from the group of collection devices consisting of: a solar electric cell adapted to provide a current output; a solar thermal cell adapted to provide a heated fluid; and a solar thermal cell adapted to provide a heated member.

8. A solar energy collection apparatus, comprising:
    a solar energy collection device; and
    a solar energy concentration device comprising a non-periodic sub-wavelength, dielectric grating and a guided mode resonant waveguide,
    wherein the non-periodic, sub-wavelength, dielectric grating is disposed between the guided mode resonant waveguide and the solar energy collection device.

9. The apparatus of claim 8, wherein the non-periodic, sub-wavelength, dielectric grating is configured to concentrate at least a portion of an incident electromagnetic radiation at a first focal length; and wherein the solar energy collection device is disposed at a distance from the solar energy concentration device approximately equal to the first focal length.

10. The apparatus of claim 8, wherein the guided mode resonant waveguide is configured to propagate at least a portion of an incident electromagnetic radiation.

11. The apparatus of claim 8, further comprising a second solar collection device disposed proximate at least a portion of the guided mode resonant waveguide.

12. The apparatus of claim 8, further comprising an articulated pivot disposed proximate the solar energy collection device.

* * * * *